United States Patent [19]

Liu et al.

[11] Patent Number: 5,167,983
[45] Date of Patent: Dec. 1, 1992

[54] METHOD OF FORMING A CONDUCTOR PATTERN ON THE INSIDE OF A HOLLOW TUBE BY REACTING A GAS OR FLUID THEREIN WITH ACTINIC RADIATION

[75] Inventors: Yung S. Liu, Schenectady; Renato Guida, Wynantskill, both of N.Y.

[73] Assignee: General Electric Company, Schenectady, N.Y.

[21] Appl. No.: 744,063

[22] Filed: Aug. 12, 1991

Related U.S. Application Data

[62] Division of Ser. No. 290,950, Dec. 28, 1988, Pat. No. 5,084,311.

[51] Int. Cl.⁵ .............................................. B05D 5/12
[52] U.S. Cl. .................... 427/105; 427/123; 427/125; 427/232; 427/235; 427/237; 427/273; 427/404
[58] Field of Search .................... 427/54.1, 105, 126.4, 427/127.5, 235, 237, 53.1, 106, 107, 123, 125, 232, 273, 404; 156/641, 643

[56] References Cited

U.S. PATENT DOCUMENTS

| | | | |
|---|---|---|---|
| 3,769,698 | 11/1973 | Lademann et al. | 29/602 |
| 4,089,991 | 5/1978 | Robillard | 427/105 |
| 4,271,370 | 6/1981 | DiMeo | 336/200 |
| 4,340,617 | 7/1982 | Duetsch et al. | 427/53.1 |
| 4,543,270 | 9/1985 | Oprysko et al. | 427/53.1 |
| 4,574,095 | 3/1986 | Baum et al. | 427/53.1 |
| 4,606,932 | 8/1986 | Oprysko et al. | 427/53.1 |
| 4,639,708 | 1/1987 | Weatherly | 336/200 |
| 4,727,234 | 2/1988 | Oprysko et al. | 427/53.1 |
| 4,859,279 | 8/1989 | Baeurle | 427/53.1 |
| 4,925,830 | 5/1990 | Walsh | 427/53.1 |
| 5,059,449 | 10/1991 | van der Putten et al. | 427/53.1 |

FOREIGN PATENT DOCUMENTS

| | | |
|---|---|---|
| 56-101543 | 8/1981 | Japan. |
| 61-88510 | 5/1986 | Japan. |
| 2094482 | 9/1982 | United Kingdom. |
| 2151791 | 7/1985 | United Kingdom. |

OTHER PUBLICATIONS

J. Bargon et al., "Manufacturing Coils and Shields", IBM Technical Disclosure Bulletin, vol. 17, No. 7, Dec. 1974, p. 2113.

Primary Examiner—Shrive Beck
Assistant Examiner—Benjamin L. Utech
Attorney, Agent, or Firm—Marvin Snyder

[57] ABSTRACT

A technique for fabricating a patterned conductor on the inner surface of a transparent tube comprises providing a source of conductive material inside a hollow tube and directing actinic radiation onto the tube wall where the deposition of a conductive pattern is desired to deposit conductive material thereon. That conductive deposit may be thickened by subsequent electroless or electroplating. The result is an improved magnetic resonance sensor comprising a hollow tube having "flat" conductor coils disposed on its interior surface.

18 Claims, 5 Drawing Sheets

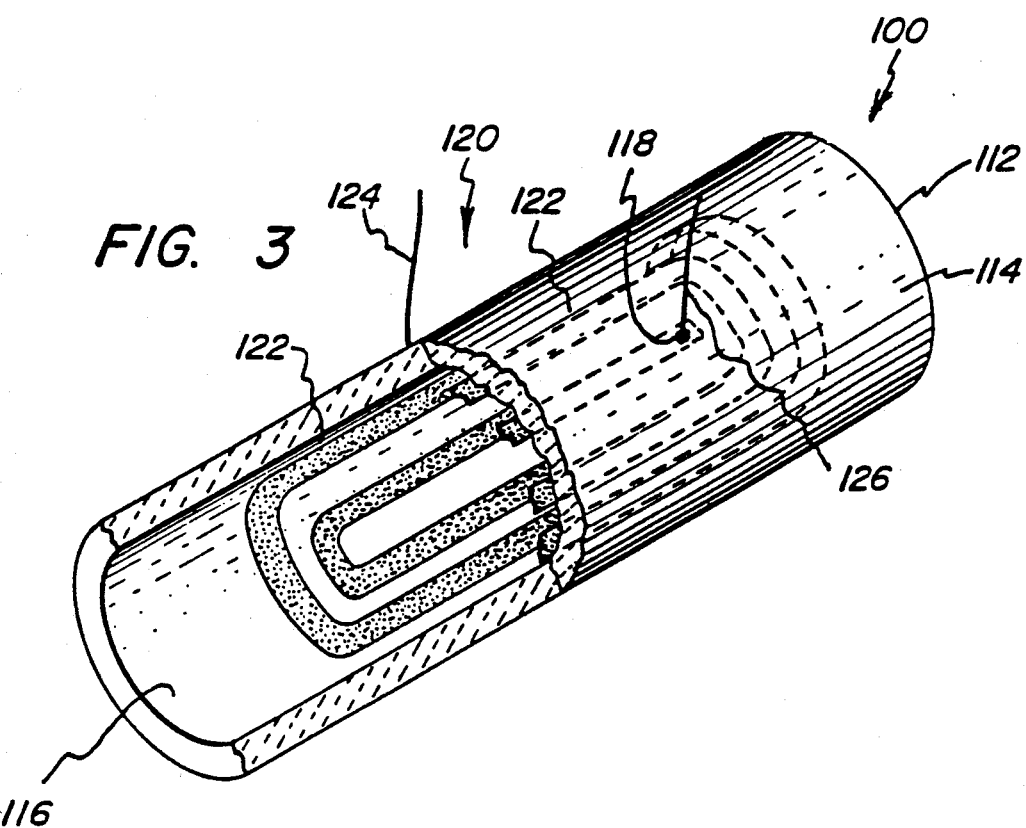
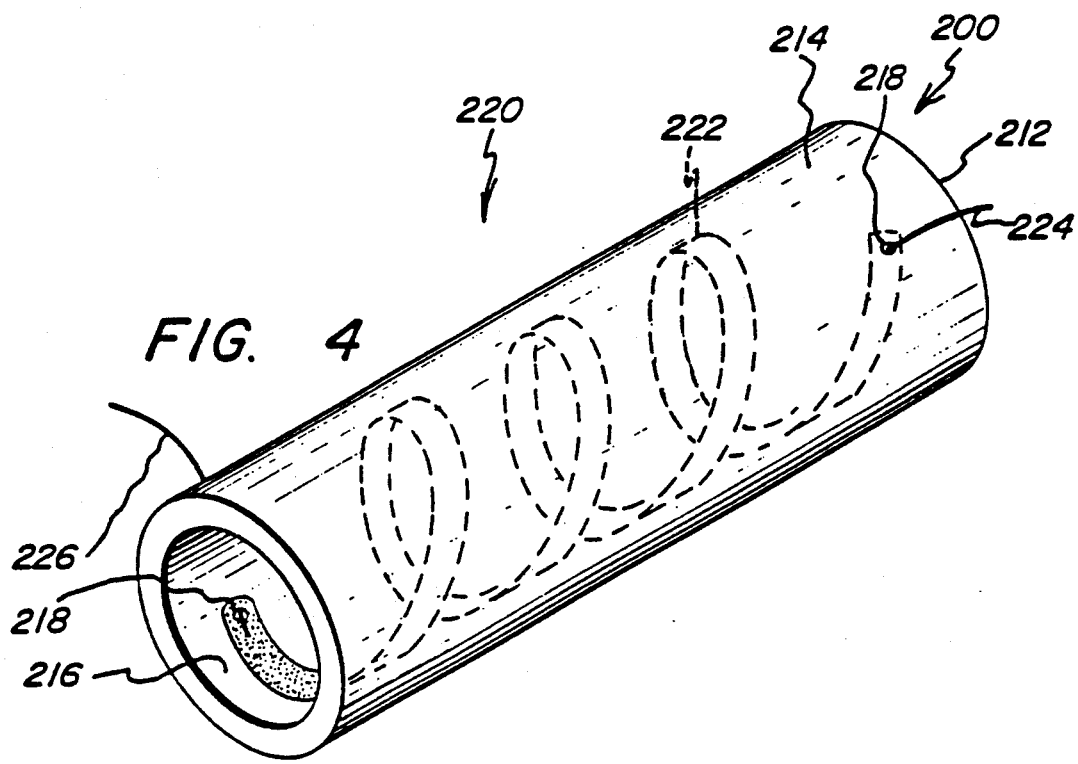

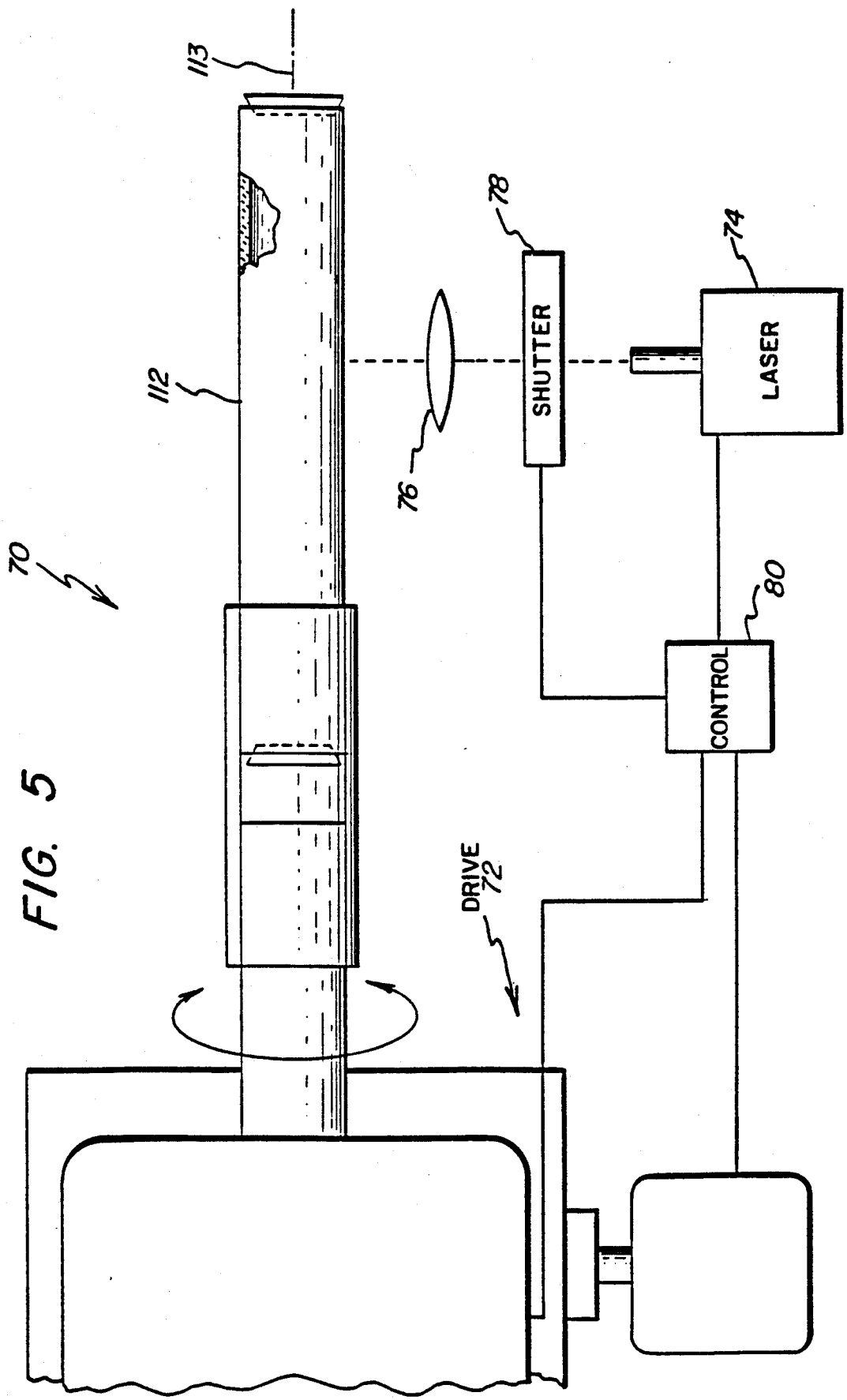

METHOD OF FORMING A CONDUCTOR PATTERN ON THE INSIDE OF A HOLLOW TUBE BY REACTING A GAS OR FLUID THEREIN WITH ACTINIC RADIATION

This application is a division of application Ser. No. 07/290,950, filed Dec. 28, 1988, now U.S. Pat. No. 5,084,311, issued Jan. 28, 1992.

BACKGROUND OF THE INVENTION

1. Field of the Invention

The present invention relates to electromagnetic transducers including conductors disposed in predetermined patterns and more particularly to patterned conductors disposed on surfaces having significant curvatures.

2. Prior Art

For accurate transduction of electromagnetic signals, transducers must have accurately known characteristics. Accurately known characteristics can be obtained in two different ways. The first is to fabricate individual transducers in an attempt to match a predetermined configuration, but with a fabrication tolerance which requires extensive testing to determine the actual characteristics of each transducer and whether it meets the intended specifications. The second is to fabricate the transducers with tight enough tolerances that simple testing can be used to establish that each transducer matches or fails to match the specifications for a standard transducer of the same design whose characteristics are accurately known from extensive testing. In the former case, substantial testing cost is added to the fabrication cost of each transducer thereby substantially increasing its cost. In the latter case the cost of extensive testing of the standard transducer is part of the initial development cost which is spread over all production transducers. It is generally recognized that the latter technique is preferable for both interchangeability of parts between systems and for limiting manufacturing and testing costs. Unfortunately, not all electromagnetic transducers are susceptible to fabrication to the tight tolerances necessary to enable the latter technique to be utilized. One type of transducer which has not been susceptible to being fabricated in the latter way is the pickup coil of the sensors used in magnetic resonance spectroscopy.

In magnetic resonance spectroscopy a strong uniform DC magnetic bias field is applied to a sample to be analyzed. This magnetic field causes the net spin axis of the electrons of the atoms comprising the sample to align parallel to the DC magnetic bias field. The sensor or pick-up coil has two halves and is located within this strong uniform magnetic field with the sample being investigated disposed between the two halves. A perturbation current is passed through this sensor coil to create a magnetic field perpendicular to the DC magnetic bias field to cause the orbits of electrons in the sample material to realign with their spin no longer in the direction of the DC magnetic bias field, and preferably perpendicular to the DC magnetic bias field. The perturbation current is then removed from the sensor coil, which removes the perturbation magnetic field. The spins of the electrons then reorient back to parallel to the DC magnetic bias field. The electromagnetic signals generated by this reorientation of the electron spins are sensed by the pick-up coil and amplified and analyzed by the electronic portion of the magnetic resonance spectroscopy machine. The frequencies of the electromagnetic signals are determined by the elements and compounds present in the sample and thus provide information which can be processed to determine the composition of the sample.

For maximum accuracy in the spectrographic analysis of the material of the sample, the sensor coil must have an accurately known configuration and must be configured in a way which causes the perturbation current through the sensor coil to generate a magnetic field which is oriented perpendicular to the main DC magnetic bias field without any significant field component parallel to the main DC bias field. Further, the pickup coil itself should have no net turns through the bias magnetic field in order that the current through the coil will not alter that DC magnetic bias field.

One prior art magnetic resonance spectroscopy pick up coil is a hollow glass tube about ⅜ inch in inner diameter with a wall thickness of about 1/16 inch and having a sensor coil disposed on its outer surface. The sensor coil comprises two diametrically opposed "flat" or pancake coils which conform to the exterior surface of the tube and are connected in series. The sample to be analyzed is passed through this tube and analyzed when it is located in the tube between the two halves of the sensor coil.

The sensor coil is formed through use of photolithographic techniques to define the coil in a separate, planar, copper foil which is preferably free of all magnetic materials. The copper foil is etched to leave the coil which is then mounted on and adhered to the exterior surface of the glass tube. Mounting the coil on the tube is a labor intensive process which is subject to significant variation even with the exercise of great care by the operator. As a result, sensor coils of this type must be extensively and carefully quality control tested prior to being accepted for shipment, sale and use as a sensor coils. Both the manual fabrication process and the extensive testing it makes necessary contribute significantly to the cost of such sensor coils. Since the basic material costs are minimal, the fabrication process and testing are the primary contributors to the cost.

Improved and less expensive coil designs and fabrication techniques are desirable.

Accordingly, it is an object of the present invention to provide a method of fabricating a magnetic resonance sensor which is accurately reproducible whereby the need for extensive testing is obviated.

It is also an object of the invention is to provide a magnetic resonance sensor fabrication technique which is inexpensive in order that the cost of such sensors may be reduced.

An additional object of the invention is to provide a technique for fabricating precision conductor patterns on surfaces having significant curvature.

Another object of the invention is to provide a technique for fabricating precision patterned conductors on the surfaces of a cylindrical object.

Another object of the invention is to provide a technique for fabricating precision patterned conductors on the interior surface of a hollow tube, which may be transparent.

A further object of the invention is to provide an improved magnetic resonance sensor.

A still further object of the invention is to provide a magnetic resonance sensor having improved sensitivity and accuracy.

A still further object of the invention is to provide a magnetic resonance sensor in which the pick up coils are immediately adjacent to the sample volume being investigated.

SUMMARY OF THE INVENTION

In accordance with the present invention, the above objects are accomplished through photoreactive control of the patterning of a conductor on a surface having significant curvature. In accordance with one embodiment of this technique, a patterned conductor is provided on the interior surface of a hollow tubular member which is transparent to a photoreactive wavelength of light. The reactive light is focussed through the wall of the tubular member onto the interior surface of that wall in order to induce or catalyze the deposition of conductive material on those portions of the inner surface onto which the light is focussed while a source material for the conductive material being deposited is present in the vicinity of that focussed light. The pattern of the conductor is determined by relative movement between the focussed light and the tube. A thicker conductive layer may be obtained by subsequently depositing additional conductive material on top of the photoreactively deposited material. Other patterning techniques may also be used.

An improved magnetic resonance sensor is provided in the form of a hollow tubular member which confines the sample during evaluation and has the magnetic resonance sensor coils disposed on its interior surface. These coils may have more turns than prior art coils, which increases their sensitivity.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

FIG. 3 illustrates, in partially cut away, perspective view, a magnetic resonance sensor in accordance with the present invention;

FIG. 4 illustrates, in perspective view, an alternative pattern for a conductor disposed on the interior surface of a hollow tubular member;

FIG. 5 illustrates in partially perspective, partially block diagram form, an apparatus for fabricating transducers in accordance with the present invention.

DETAILED DESCRIPTION OF THE INVENTION

Figure 1:
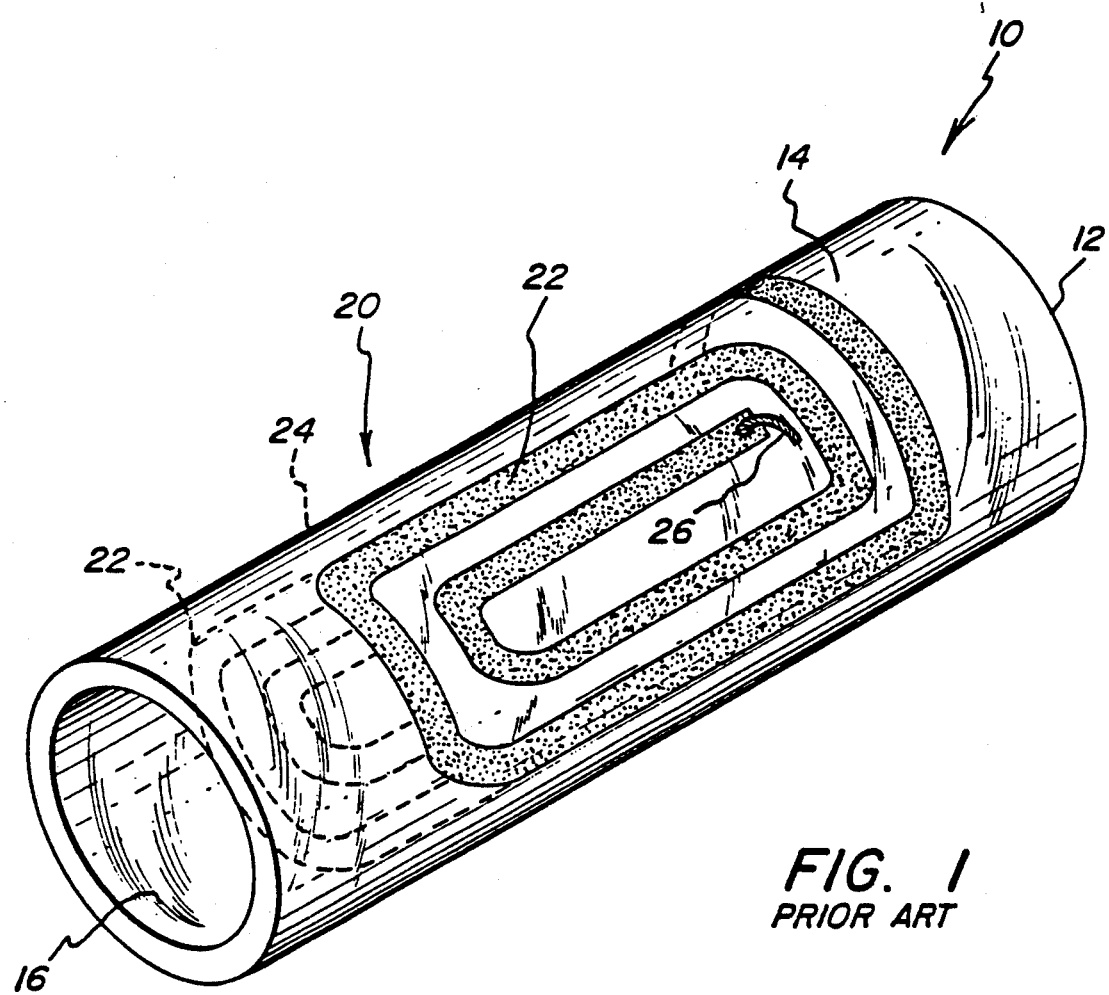
FIG. 1 illustrates, in perspective view, a prior art magnetic resonance sensor.
Figure 2:
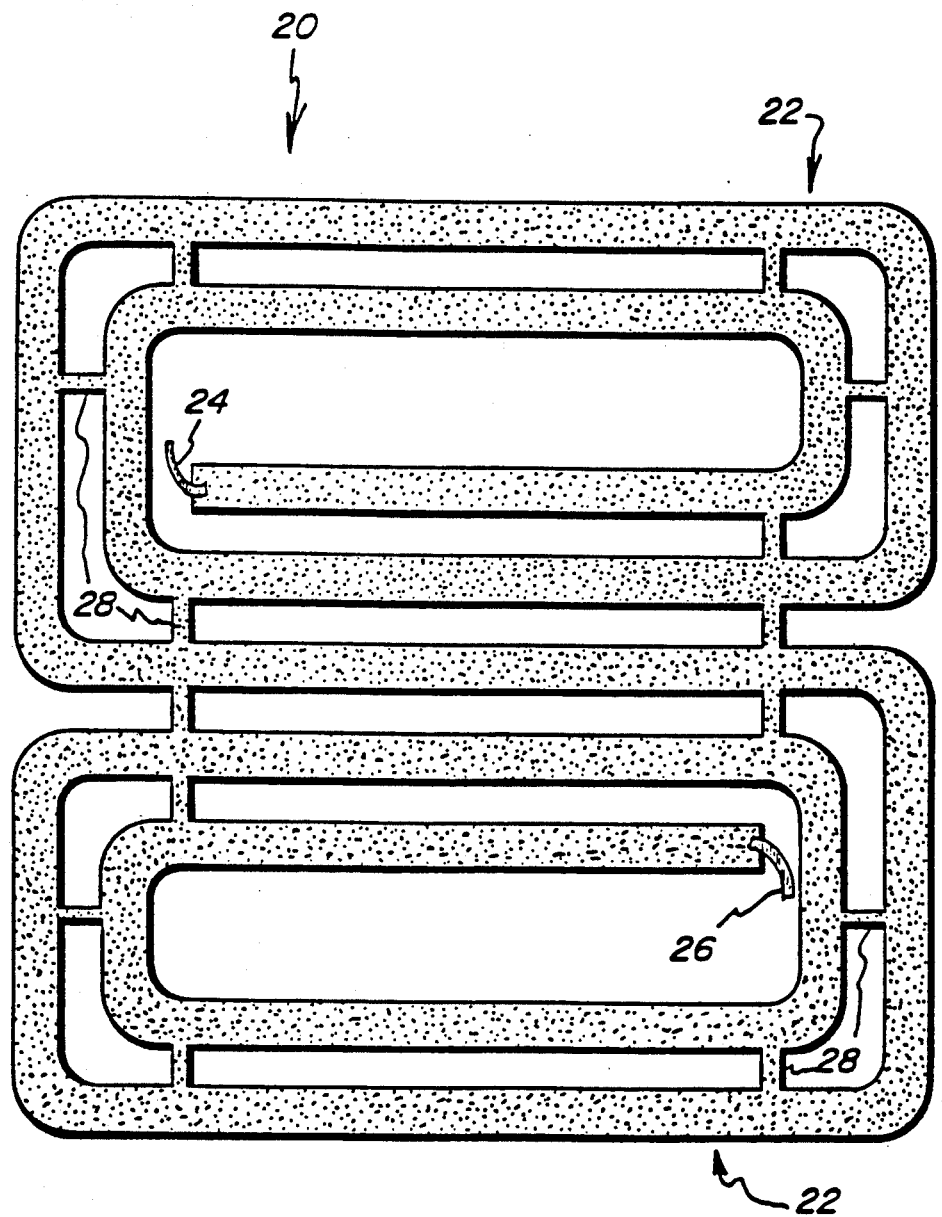
FIG. 2 illustrates, in plan view, a prior art sensor coil prior to its application to the tube.

A state of the prior art magnetic resonance sensor for use in spectroscopy is illustrated in FIG. 1. The sensor 10 comprises a hollow glass tube 12 having an exterior surface 14 and an interior surface 16. For magnetic resonance spectroscopy, this tube is typically less than an inch in diameter and may have an inner diameter of about ⅛ inch. A conductor pattern 20 is disposed on exterior surface 14 of the tube 12. The pattern 20 comprises two "flat" coils 22 which are connected in series and have external leads 24 and 26 connected to opposing ends of the conductor. In accordance with the prior art fabrication techniques, the conductor pattern is initially formed by photolithographic processing of a copper foil to provide the conductor 20 in its flat coil form as shown in FIG. 2. Bridge connectors 28 are included in the etched pattern of the foil in order to hold the coil pieces in their desired relative positions during assembly. The coils 22 are assembled on the tube 12 in diametrically opposed positions to form the sensor 10 of FIG. 1. One assembly process involves applying a layer of epoxy to the exterior surface of the tube where the coil is to be located, laying the coil in place and allowing the epoxy to cure. Thereafter, the copper tabs or bridges 28, shown in FIG. 2, are cut and removed to leave the desired coil shape on the glass tube as shown in FIG. 1. This process is labor intensive, requires pains-taking skilled manipulation of small parts, and results in sensor-to-sensor variations as a result of coil-to-coil variations in shape and placement. Substantial testing is required to insure that a given sensor 10 meets specifications before that sensor can be accepted for use. The sample to be analyzed by magnetic resonance spectroscopy is passed through the tube 12 and either held stationary or moved at a known rate during analysis. The sample is analyzed when it is located between the two halves of the pickup coil.

A magnetic resonance sensor 100 in accordance with the present invention is illustrated in FIG. 3. The sensor 100 comprises a glass tube 112 having an outer surface 114 and an inner surface 116. A conductive pattern 120 is disposed on the inner surface 116 of tube 112. The pattern 120 consists of two coils 122 connected in series, each of which comprises a plurality of oblong turns whose long sides run parallel to the axis of the tube, and which are situated diametrically opposite each other. The conductor 120 has first and second external leads 124 and 126. The leads 124 and 126 preferably are attached to the exterior surface 114 of the tube and extend through holes 118 in the tube wall into the interior of the tube. The holes 118 may be laser-drilled or fabricated in other ways. The connection from the winding 122 on the inside surface 116 to the external leads 124 and 126 may be via through-plating on the holes 118, via eyelets inserted in the holes, or by other appropriate means.

In accordance with the methods of fabrication to be described hereinafter, the sensor 100 is accurately reproducible with the result that minimal testing is required to ensure that a given sensor 100 meets specifications. In particular, the problems of misorientation and variations in the shape of and spacings between adjacent turns of the winding are eliminated by the method of fabrication, with the result that once an acceptable configuration for the sensor 100 and its conductive pattern 120 has been determined and produced, concerns about sensor-to-sensor variations in coil position, spacing and orientation are eliminated. As a result, simple testing is sufficient to certify that the sensor meets specifications.

While the conductive pattern 120 is described and shown as being disposed on the inner surface 116 of the tube 112, it will be understood that although that is preferred, the patterned conductor may be disposed on the exterior surface 114 if desired. Such exterior placement increases the spacing between the sample and the coil, which reduces sensitivity and is therefore considered less desirable than interior placement. However, external placement is feasible where the difference in sensitivity is considered acceptable. Exterior placement of this coil still provides substantial improvement over prior art sensors 10 because of the increased number of turns which may be provided in the inventive coil and because of the increased precision with which the inventive coil is fabricated. This precision minimizes the quantity of testing necessary to certify that the sensor meets specifications and also substantially eliminates the problem of rejection of finished sensors as not meeting specifications, thereby increasing yield and reducing costs.

The method of this invention may be utilized to produce many different conductor patterns on the surface of a tube or other structure having a significant curvature to its surface. One such alternative pattern is shown in FIG. 4 where a transducer 200 comprise a tube 212 having an exterior surface 214 and an interior surface 216. A patterned conductor 220 is disposed on the interior surface 216 of the tube 212. The conductor 220 is in the form of a single helical spiral 222 having a first external lead 224 connected to one end and a second external lead 226 connected to its other end. Leads 224 and 226 are preferably connected to conductor 220 via through holes in the tubing wall. The transducer 200 is suitable for producing or responding to magnetic fields which run axially of the tube 212.

Many variations on the conductor pattern are possible. These include, but are not limited to, a plurality of parallel conductors, which may be helical, for example, or a plurality of conductors connected in common at one or both ends, and so forth. In accordance with the invention, almost any conductive pattern can be created, so long as it does not involve crossovers in which the second conductor to be defined would be shadowed by the first conductor deposited. The problem of shadowing can be overcome by projecting the laser light through the tube wall on which shadowing does not occur and through the gas within the tube to focus on the tube wall on which shadowing does occur. Naturally, if crossing conductors are to be insulated from each other and are disposed on the same wall surface, an insulating layer must be applied before the second conductor is deposited.

Figure 6:
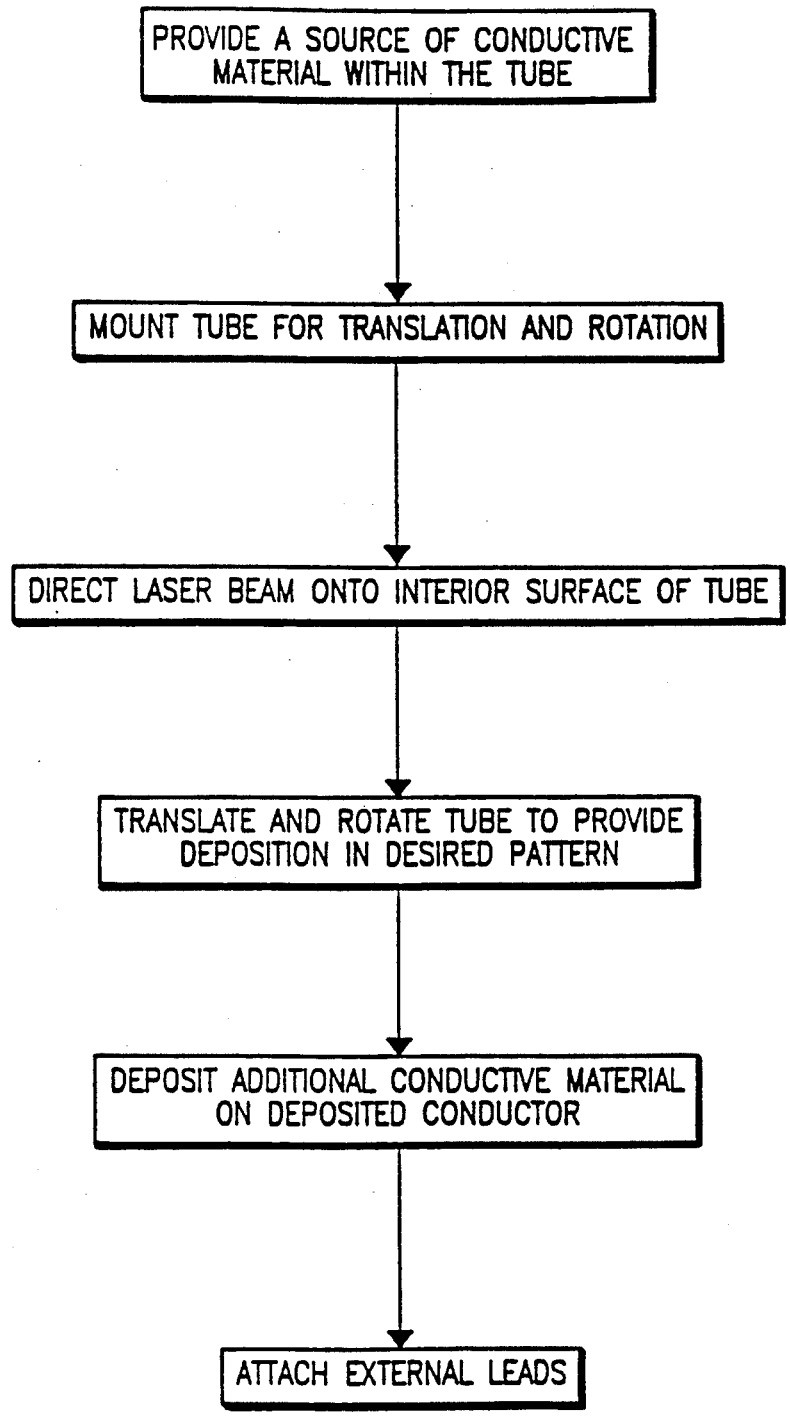
FIG. 6 illustrates a process of fabricating transducers in accordance with the present invention.

The sensor 100 is preferably fabricated by the method illustrated in FIG. 6 using the apparatus shown schematically in FIG. 5.

The first step in the process is providing in the tube 112 a material which will deposit a conductor on the wall of the tube where the photochemically active or actinic light is focused. For example, tungsten hexafluoride ($WF_6$) mixed with hydrogen gas at a pressure of about 100 Torr has been used as this material in order to deposit tungsten on the tube wall, but many other materials may be used. The ends of the tube are preferably closed with plugs to contain the desired gas and to exclude undesirable gases. The terms photoreactive light, reactive light, photochemically active light and actinic light are used interchangeably in this specification and are used herein in the broad sense of producing a physical effect or change in or of material which is exposed to it. This may involve a chemical change, evaporation, sublimation, delamination or any other physical change in accordance with the circumstances.

The second step is mounting the tube 112 in a deposition system 70 which includes manipulation or drive apparatus 72 which is capable of rotating the tube about its longitudinal axis 113 and translating the tube parallel to its longitudinal axis.

The third step is positioning and focusing a laser 74 which is preferably a continuous wave (CW) laser to direct its emissions on the tube 112. A focusing objective 76 is adjusted to focus the laser's beam on the interior surface of the tube which is closest to the laser source. A shutter 78 may be used to interrupt the laser beam. The entire system operates under the control of a control unit 80, or may be manually operated. A laser having an emission spectrum which is photochemically active is selected in accordance with the deposition process being used. Focusing of the laser may be accomplished before the tube is positioned or while the laser is directed at a portion of the tube 112 which is spaced from the desired location of the conductive pattern or it may be done while the laser is directed at a portion of the area where the conductive pattern is to be disposed.

Fourth, the laser is turned on and drive 72 rotates and translates tube 112 in a pattern to cause the focused laser beam to trace, on the interior surface 116 of the tube, the desired pattern of the conductive layer 120 which, in the example given, comprises tungsten. The laser light may be interrupted by shutter 78 or by turning off the laser power at those times when it is desired to skip from one point to another without depositing a conductive trace. With an argon laser Model 2025-05 made by Spectra Physics, operating at a power level of 50 mW, a translation rate of up to 1 mm per second has been found to produce a continuous conductive trace with the specified gaseous source material. Other source material pressures and other source materials may enable or require different tracing rates. The minimum conductive trace width is determined by the focus of the laser. Thus, in this example, when the laser was focused to a spot of about 30 microns in diameter, a trace about 20 microns wide resulted. Defocusing the laser to a spot size of about 100 microns resulted in a conductive trace having a width of about 60 microns.

Fifth, for any of the conductive patterns where a high conductivity is desired for the pattern, additional conductive material may be deposited on the initial laser-induced deposit, such as by electroless plating or electroplating, to make the initial deposit thicker, more conductive and capable of carrying larger currents. Such plating can also provide a substantial reduction in the resistance of the winding. This is particularly true where the initially deposited conductive material has a relatively high resistance as compared to the subsequently deposited material which may be a material such as electroplated copper which has a substantially higher conductivity than tungsten.

Sixth, the external leads are attached to the ends of the coil. Alternatively, the external leads may be attached before laser deposition or before the thickening deposition.

The source material in the foregoing process may be a liquid or a solid instead of a gas at the time of exposure. For example, a solution of palladium acetate in chloroform was prepared and the interior of the tube coated with that solution by immersing the tube in the solution. The coating was air dried and then exposed to actinic radiation, as discussed above, to deposit palladium in the desired conductor pattern. The unexposed palladium acetate and the residues from the exposed palladium acetate were then removed by rinsing the tube in chloroform. Copper was then deposited on the palladium using an electroless copper deposition process in which the palladium catalyzed the deposition of the copper.

This same process can be performed using the palladium acetate in chloroform solution as a liquid source of the palladium by filling the tube with that solution and then illuminating the tube in the desired pattern as heretofore described. In filling the tube with a liquid source, pressure relief should be provided to ensure that any subsequent heating of the liquid by the laser beam will not result in an explosion or other damage to the tube, apparatus or operator.

Useful source materials include, but are not limited to carbonyl, alkyl, halide and hydrogen compounds of elements such as tungsten, zinc, aluminum, molybdenum, platinum, palladium, copper, gold and silicon. Any compound containing a metallic element whose deposition can be induced by light may be used as a source material.

Many alternative methods may be used to produce coils in accordance with the present invention. For example, a continuous conductive film may be deposited on the interior surface of the tube and the laser then focused through the tube wall onto the interface between the conductive layer and the glass with sufficient power applied to cause the conductive layer to sublime, evaporate or otherwise evolve or separate from the surface in a pattern which leaves the conductor only in those locations which correspond to a predetermined pattern.

In another alternative embodiment, a solvent-based acrylated liquid coat of photoresist, such as Fanton TM photoresists available from Armstrong World Industries, Inc., may be deposited on the interior surface of the tube, exposed by laser tracing through the tube wall and then developed to leave the photoresist on the interior surface of the tube in the negative of the desired conductor pattern. This tracing may be executed using the same apparatus (shown in FIG. 5) as that used for the direct deposition of conductive material from a gas as has been described. Fanton photoresist is presently preferred for this use because its exposure is much less sensitive to its thickness than other photoresists are. The conductor may then be deposited over the photoresist and the photoresist removed to lift off the conductor except where the conductor is directly disposed on the tube surface.

As a further alternative, a continuous conductive film may be formed on the interior surface of the tube and the Fanton photoresist deposited over the conductive film. The photoresist is then exposed using laser light directed onto the photoresist from the interior of the tube. While a variety of means may be used for directing this laser light, optical fibers are suitably small in diameter and capable of carrying sufficient light intensity to expose the photoresist in accordance with a tracing of the spot on the surface. Thereafter the photoresist is developed, the deposited conductor is etched or otherwise removed where the photoresist has been removed, and then the remaining or protective portion of the photoresist is removed to leave the desired conductor pattern on the interior of the tube surface. This conductor pattern may also be thickened by electroless or electroplating or other deposition as desired.

While the discussion thus far has been in terms of conductor patterns disposed on the interior surface of the glass tube, similar conductor patterns may be provided on the exterior surface of the tube with the same precision and repeatability benefits as have been described for the interior placement of the conductor pattern.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of forming a desired conductor pattern on the inner surface of a hollow tubular member comprising:
   providing said hollow tubular member;
   providing within said hollow tubular member a source of a conductive material to be deposited on said inner surface of said tubular member;
   providing a source of photochemically active light having a wavelength which is capable of causing said conductive material to deposit from said source material onto said inner surface of said tubular member; and
   directing said light onto said inner surface in a pattern corresponding to said desired conductor pattern to cause deposition of said conductive material from said source material onto an extended longitudinal portion of said inner surface, where either said hollow tubular member is transparent to said light or said light is directed onto said inner surface via an optical fiber inserted within the interior of said hollow tubular member where said light strikes said inner surface.

2. The method recited in claim 1 wherein:
   the step of providing a source material comprises providing a fluid source material.

3. The method recited in claim 2 wherein said fluid source material comprises a compound of a metallic element.

4. The method recited in claim 3 wherein said metallic element is selected from the group consisting of tungsten, zinc, aluminum, molybdenum, platinum, palladium, copper, gold and silicon.

5. The method recited in claim 2 further comprising, after the directing step:
   increasing the thickness of the patterned conductor by depositing additional conductive material on said patterned conductor.

6. The method recited in claim 1 wherein:
   the step of providing a source material comprises providing a gaseous source material.

7. A method of forming a patterned conductor on the inner surface of a hollow tubular member comprising:
   providing said hollow tubular member;
   forming a continuous layer of conductive material on at least an extended longitudinal portion of the inner surface of said hollow tubular member; and
   selectively removing portions of said continuous layer of conductive material from said extended longitudinal portion of the inner surface of said tubular member in accordance with a pattern of light impinging on said layer to leave a predetermined pattern of conductive material on the extended longitudinal portion of the inner surface of said tubular member,
   where either said hollow tubular member is transparent to said light or said light is directed onto said inner surface via an optical fiber inserted within the interior of said hollow tubular member.

8. The method recited in claim 7 wherein the removing step comprises:
   providing a source of light; and
   directing the light from said source on the portions of said continuous layer of conductive material which it is desired to remove in an intensity and for a time sufficient to cause the conductive material illuminated thereby to separate from said inner surface of said tubular member and from the portions of said conductive layer which were not exposed to said light.

9. The method recited in claim 8 wherein said tubular member is transparent to said light and said light is directed through the thickness of the wall of said tubular member onto the surface of the conductive layer which is in contact with said wall.

10. The method recited in claim 9 wherein said light is directed onto said conductive layer from within the hollow interior of said hollow tubular member.

11. The method recited in claim 9 wherein the directing step comprises passing said light through an optical transmission system which extends into the hollow interior of said tubular member.

12. The method recited in claim 11 wherein the step of passing said light through an optical transmission system comprises passing said light through a fiber optic transmission system.

13. The method recited in claim 8 wherein the step of providing a source of light comprises providing a laser having a wavelength suitable for performing the selectively removing step.

14. The method recited in claim 13 wherein the step of depositing said photoresist layer comprises depositing a layer of solvent-based acrylated liquid photoresist.

15. The method recited in claim 7 wherein the light from said source is directed onto said layer in the form of a small spot and wherein said method further comprises moving said spot relative to said tubular member in a pattern which traces the area from which conductive material is to be removed.

16. The method recited in claim 7 wherein the selectively removing step comprises:
   depositing a layer of photoresist over said conductive layer in the interior of said hollow tubular member;
   exposing and developing said photoresist in a pattern corresponding to said desired conductor pattern; and
   removing the portions of said conductive layer which are not protected by said photoresist.

17. The method recited in claim 16 further comprising, after the step of removing the unprotected conductive material:
   removing the remaining portions of said photoresist layer from the remaining portions of said conductive layer.

18. The method recited in claim 17 further comprising after the step of removing said remaining portions of said photoresist layer:
   increasing the thickness of said conductive pattern by depositing additional conductive material onto the remaining portions of said conductive layer.

* * * * *